(12) United States Patent
Maeda

(10) Patent No.: US 7,431,625 B2
(45) Date of Patent: Oct. 7, 2008

(54) PREBROKEN PANEL, DISPLAY, AND METHOD OF MANUFACTURING THE SAME

(75) Inventor: Norihisa Maeda, Ishikawa-gun (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 425 days.

(21) Appl. No.: 11/304,663

(22) Filed: Dec. 16, 2005

(65) Prior Publication Data

US 2006/0132033 A1   Jun. 22, 2006

(30) Foreign Application Priority Data

Dec. 21, 2004   (JP)   ............................. 2004-369565
Oct. 20, 2005   (JP)   ............................. 2005-305696

(51) Int. Cl.
*H01J 9/00* (2006.01)
(52) U.S. Cl. ..................................... 445/23
(58) Field of Classification Search ............. 445/23–25; 428/192
See application file for complete search history.

(56) References Cited

FOREIGN PATENT DOCUMENTS

| JP | 2000-19536 | 1/2000 |
|---|---|---|
| JP | 2002-329576 | 11/2002 |

*Primary Examiner*—Joseph L Williams
(74) *Attorney, Agent, or Firm*—Oblon, Spivak, McClelland, Maier & Neustadt, P.C.

(57) ABSTRACT

A method of manufacturing an organic EL display includes forming organic EL elements on a first portion of a first substrate, forming a frame-shaped sealing resin layer on the first portion such that the sealing resin layer surrounds the organic EL elements, putting the first substrate and a second substrate together such that the sealing resin layer is interposed between the first and second substrates, thereby forming a prebroken panel, and breaking the first substrate of the prebroken panel along a boundary between the first portion and a second portion of the first substrate, wherein, before forming the sealing resin layer, a release layer is formed on the second portion at a position adjacent to the boundary, the release layer including a layer made of a material equal to a material of a layer included in an organic layer of the organic EL element.

15 Claims, 10 Drawing Sheets

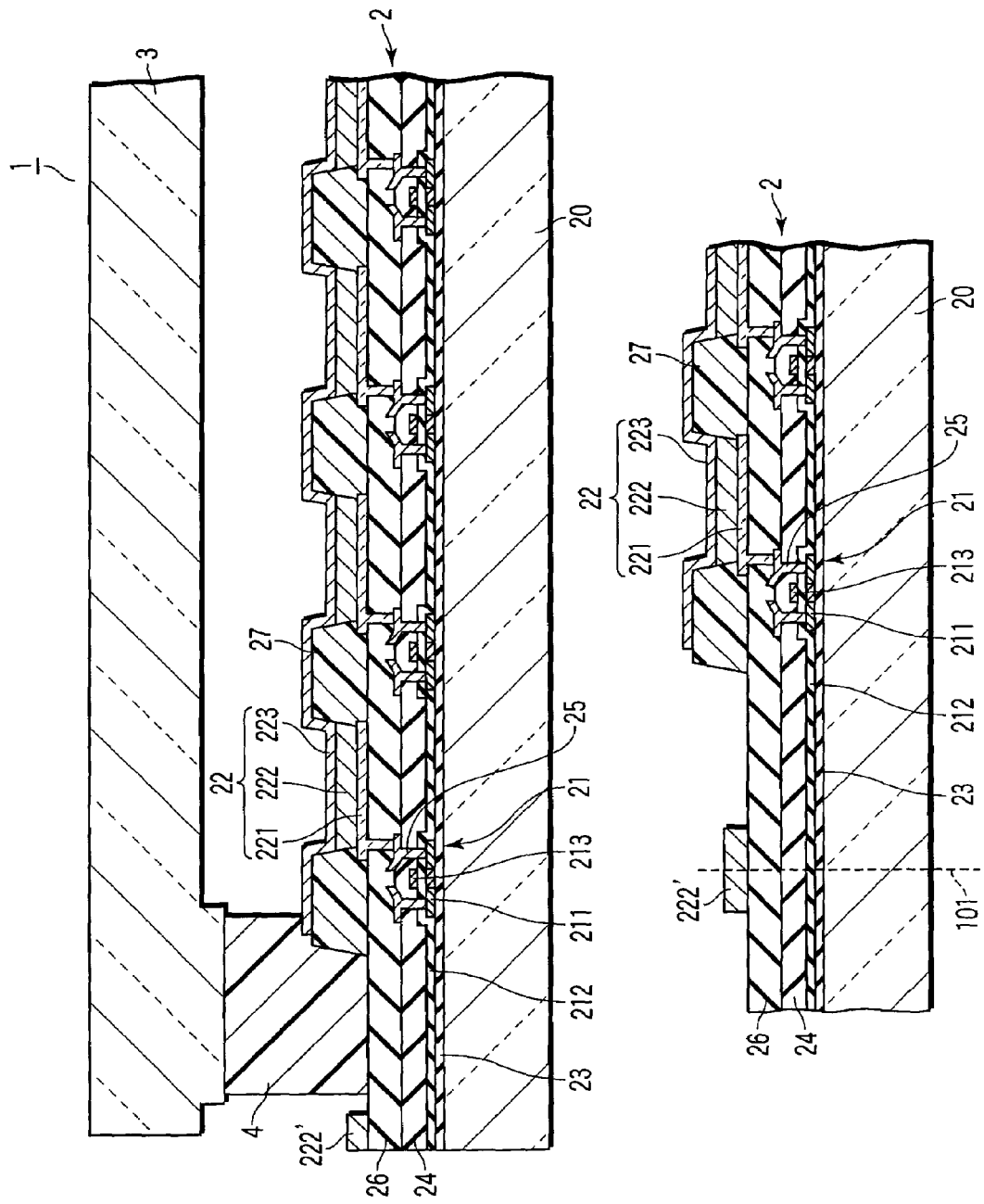

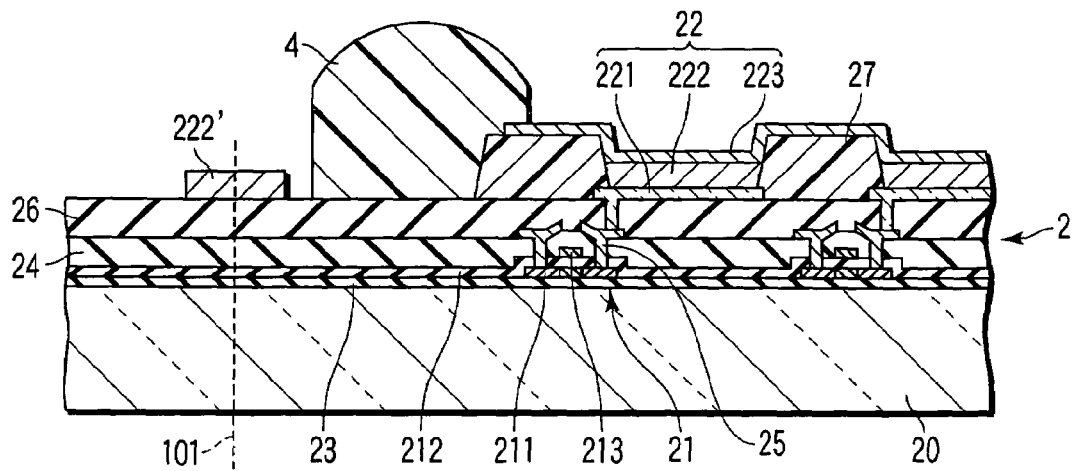
F I G. 3
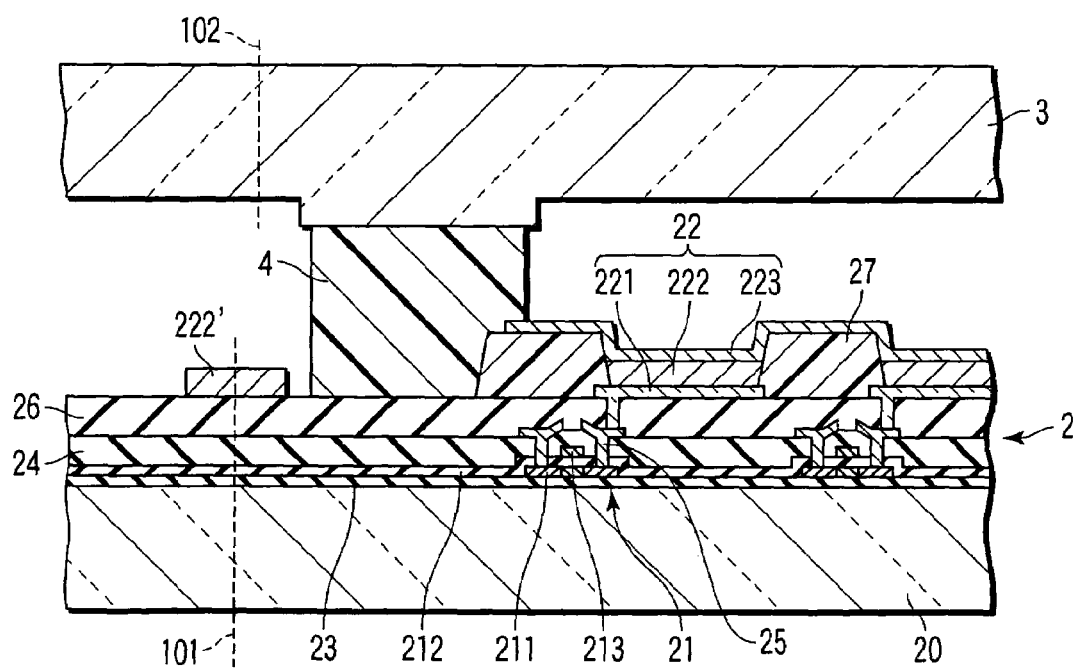
F I G. 4

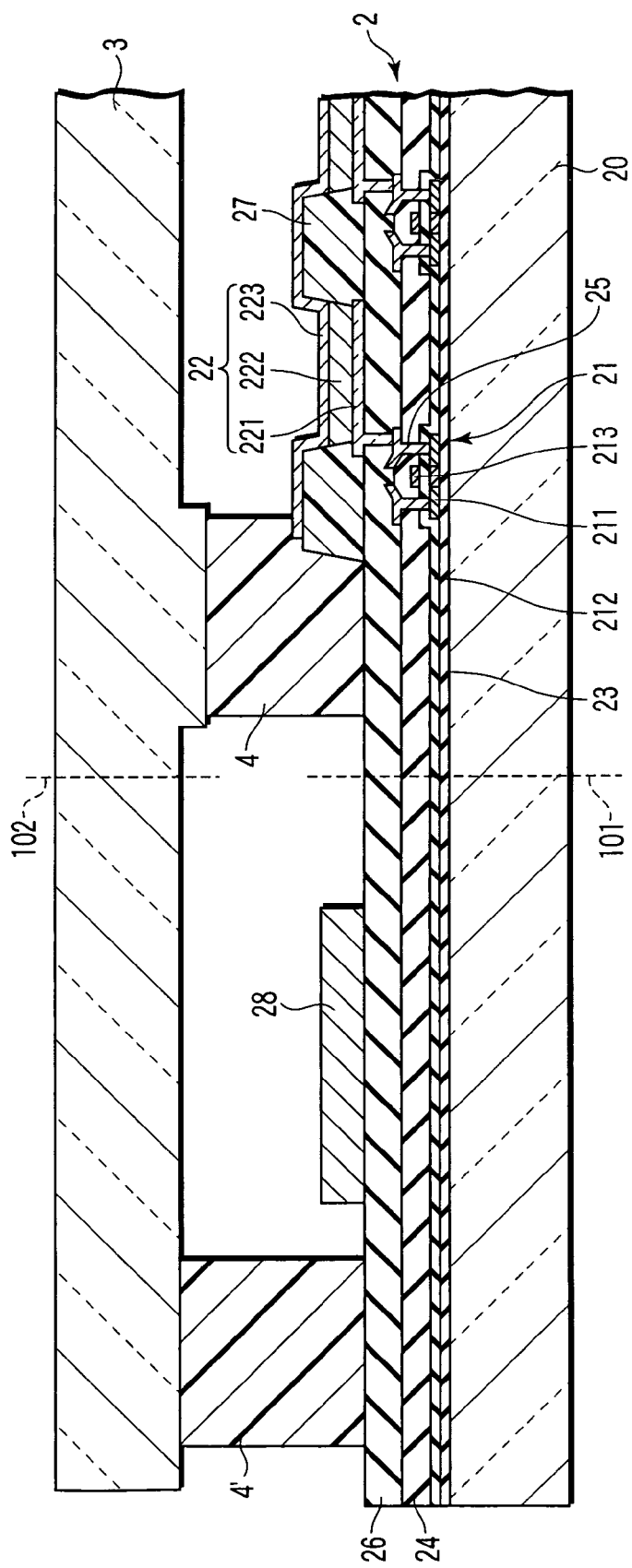
F I G. 14

PREBROKEN PANEL, DISPLAY, AND METHOD OF MANUFACTURING THE SAME

CROSS-REFERENCE TO RELATED APPLICATIONS

This application is based upon and claims the benefit of priority from prior Japanese Patent Applications No. 2004-369565, filed Dec. 21, 2004; and No. 2005-305696, filed Oct. 20, 2005, the entire contents of both of which are incorporated herein by reference.

BACKGROUND OF THE INVENTION

1. Field of the Invention

The present invention relates to an organic electroluminescent (EL) display, a prebroken panel to be broken into at least one display panel which is used in the display, and a method of manufacturing the display.

2. Description of the Related Art

When an organic EL element as a main part of an organic EL display is exposed to moisture or oxygen, oxidation of a cathode or separation of the cathode from an organic layer readily occurs. In an organic EL display, therefore, organic EL elements are sealed by using a structure in which, e.g., a sealing substrate is placed to face an array substrate and a sealing resin layer is interposed between peripheries of these substrates, thereby sealing the organic EL elements.

An organic EL display employing such a structure is generally manufactured by the following method. First, various elements and interconnections are formed on a large insulating substrate. Then, organic EL elements are sealed as described above. After that, a plurality of organic EL displays are obtained by breaking the substrates.

Recently, reducing picture-frame size of these organic EL displays is being required. Accordingly, it becomes necessary to perform the above-mentioned breaking at a position close to the sealing resin layer. However, the present inventor has found that if the distance between the breaking line and sealing resin layer is shortened, the yield significantly decreases because the sealing resin layer tends to be formed on the breaking line.

BRIEF SUMMARY OF THE INVENTION

According to a first aspect of the present invention, there is provided a method of manufacturing an organic EL display, comprising forming organic EL elements on a first portion of a first substrate which comprises the first portion and a second portion, wherein each of the organic EL elements comprises a pair of electrodes and an organic layer interposed between the electrodes and including an emission layer, forming a frame-shaped sealing resin layer on the first portion such that the frame-shaped sealing resin layer surrounds the organic EL elements, putting the first substrate and a second substrate together such that the frame-shaped sealing resin layer is interposed between the first and second substrates, thereby forming a prebroken panel to be broken into at least one display panel, and breaking the first substrate of the prebroken panel along a boundary between the first and second portions, wherein, before forming the frame-shaped sealing resin layer, a release layer is formed on the second portion at a position adjacent to the boundary, the release layer comprising a layer made of a material equal to a material of a layer included in the organic layer.

According to a second aspect of the present invention, there is provided a method of manufacturing an organic EL display, comprising forming organic EL elements on a first portion of a first substrate which comprises the first portion and a second portion, wherein each of the organic EL elements comprises a pair of electrodes and an organic layer interposed between the electrodes and including an emission layer, forming a frame-shaped sealing resin layer and a dummy sealing resin layer on the first and second portions, respectively, such that the frame-shaped sealing resin layer surrounds the organic EL elements and is spaced apart from the dummy sealing resin layer, putting the first substrate and a second substrate together such that the first portion faces a third portion of the second substrate with the frame-shaped sealing resin layer interposed therebetween and the second portion faces a fourth portion of the second substrate with the dummy sealing resin layer interposed therebetween, thereby forming a prebroken panel to be broken into at least one display panel, breaking the first substrate of the prebroken panel along a first boundary between the first and second portions, and breaking the second substrate of the prebroken panel along a second boundary between the third and fourth portions, wherein, before forming the frame-shaped sealing resin layer, a first release layer is formed on the second portion at a position adjacent to the first boundary, the first release layer comprising a layer made of a material equal to a material of a layer included in the organic layer, and wherein, before forming the dummy sealing resin layer, a second release layer is formed on the second portion at a position where the dummy sealing resin layer is to be formed, the second release layer comprising a layer made of a material equal to a material of a layer included in the organic layer.

According to a third aspect of the present invention, there is provided a method of manufacturing an organic EL display, comprising forming organic EL elements on a first portion of a first substrate which comprises the first portion and a second portion, wherein each of the organic EL elements comprises a pair of electrodes and an organic layer interposed between the electrodes and including an emission layer, forming a frame-shaped sealing resin layer and a dummy sealing resin layer on the first and second portions, respectively, such that the frame-shaped sealing resin layer surrounds the organic EL elements and is spaced apart from the dummy sealing resin layer, putting the first substrate and a second substrate together such that the first portion faces a third portion of the second substrate with the frame-shaped sealing resin layer interposed therebetween and the second portion faces a fourth portion of the second substrate with the dummy sealing resin layer interposed therebetween, thereby forming a prebroken panel to be broken into at least one display panel, breaking the first substrate of the prebroken panel along a first boundary between the first and second portions, and breaking the second substrate of the prebroken panel along a second boundary between the third and fourth portions, wherein, before forming the dummy sealing resin layer, a release layer is formed on the second portion at a position where the dummy sealing resin layer is to be formed, the release layer comprising a layer made of a material equal to a material of a layer included in the organic layer.

According to a fourth aspect of the present invention, there is provided a prebroken panel to be broken into at least one display panel, comprising first and second substrates which face each other and are spaced apart from each other, organic EL elements which are arranged on a main surface of the first substrate facing the second substrate and each of which comprises a pair of electrodes and an organic layer interposed between the electrodes and including an emission layer, a frame-shaped sealing resin layer which is interposed between the first and second substrates and surrounds the organic EL elements, and a first release layer which is located on the main surface of the first substrate facing the second substrate and surrounds the frame-shaped sealing resin layer, the first release layer including a layer made of a material equal to a material of a layer included in the organic layer.

According to a fifth aspect of the present invention, there is provided a prebroken panel to be broken into at least one display panel, comprising first and second substrates which face each other and are spaced apart from each other, organic EL elements which are arranged on a main surface of the first substrate facing the second substrate and each of which comprises a pair of electrodes and an organic layer interposed between the electrodes and including an emission layer, a frame-shaped sealing resin layer which is interposed between the first and second substrates and surrounds the organic EL elements, a dummy sealing resin layer which is located between the first and second substrates and outside the frame-shaped sealing resin layer, and a release layer which is interposed between the first substrate and the dummy sealing resin layer and includes a layer made of a material equal to a material of a layer included in the organic layer.

According to a sixth aspect of the present invention, there is provided a prebroken panel to be broken into display panels, comprising first and second substrates which face each other and are spaced apart from each other, display regions which are arranged on a main surface of the first substrate facing the second substrate and are spaced apart from each other, each of the display regions including organic EL elements which are arranged on the main surface of the first substrate facing the second substrate and each of which comprises a pair of electrodes and an organic layer interposed between the electrodes and including an emission layer, frame-shaped sealing resin layers which are interposed between the first and second substrates and surround the display regions, respectively, and first release layers which are located on the main surface of the first substrate facing the second substrate and surround the frame-shaped sealing resin layers, respectively, each of the first release layers including a layer made of a material equal to a material of a layer included in the organic layer.

According to a seventh aspect of the present invention, there is provided a prebroken panel to be broken into display panel, comprising first and second substrates which face each other and are spaced apart from each other, display regions which are arranged on a main surface of the first substrate facing the second substrate and are spaced apart from each other, each of the display regions including organic EL elements which are arranged on the main surface of the first substrate facing the second substrate and each of which comprises a pair of electrodes and an organic layer interposed between the electrodes and including an emission layer, frame-shaped sealing resin layers which are interposed between the first and second substrates and surround the display regions, respectively, dummy sealing resin layers which are located between the first and second substrates and outside the frame-shaped sealing resin layers, and release layers which are interposed between the first substrate and the dummy sealing resin layers and each includes a layer made of a material equal to a material of a layer included in the organic layer.

According to an eighth aspect of the present invention, there is provided a display comprising first and second substrates which face each other and are spaced apart from each other, organic EL elements which are arranged on a main surface of the first substrate facing the second substrate and each of which comprises a pair of electrodes and an organic layer interposed between the electrodes and including an emission layer, a frame-shaped sealing resin layer which is interposed between the first and second substrates and surrounds the organic EL elements, and a first release layer which is located on the main surface of the first substrate facing the second substrate and surrounds the frame-shaped sealing resin layer, the first release layer including a layer made of a material equal to a material of a layer included in the organic layer.

BRIEF DESCRIPTION OF THE SEVERAL VIEWS OF THE DRAWING

FIG. 1 is a sectional view schematically showing an example of an organic EL display which can be manufactured by a method according to the first embodiment of the present invention;

FIGS. 2 to 5 are sectional views schematically showing the method of manufacturing the organic EL display according to the first embodiment of the present invention;

FIGS. 14 and 15 are sectional views schematically showing a method of manufacturing an organic EL display according to the second comparative example;

DETAILED DESCRIPTION OF THE INVENTION

Figure 5:
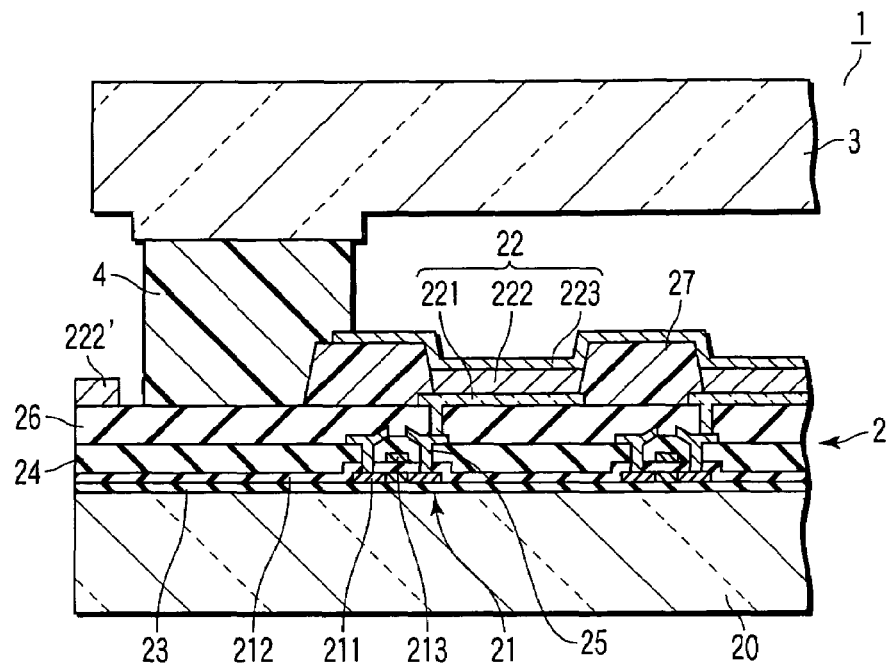

Embodiments of the present invention will be described in detail below with reference to the accompanying drawing. Note that the same reference numerals in the drawing denote constituent elements which achieve the same or similar functions, and an repetitive explanation thereof will be omitted.

FIG. 1 is a sectional view schematically showing an example of an organic EL display which can be manufactured by a method according to the first embodiment of the present invention. Referring to FIG. 1, an organic EL display 1 is drawn such that the display surface, i.e., the front surface or light emission surface faces downwardly, and the back surface faces upwardly.

The organic EL display 1 shown in FIG. 1 is a bottom emission organic EL display using an active matrix driving method. The organic EL display 1 includes an array substrate 2, a sealing substrate 3 facing the array substrate 2, and a sealing resin layer 4 interposed between the peripheries of these substrates.

The array substrate 2 includes a transparent substrate such as a glass substrate as an insulating substrate 20. A plurality of pixels are arranged in a matrix form on the insulating substrate 20. Each pixel includes, e.g., a drive control element 21 and organic EL element 22 connected in series between a pair of power supply terminals, and a pixel switch (not shown).

The drive control element 21 has a control terminal connected to a video signal line (not shown) via the pixel switch, and outputs, to the organic EL element 22, an electric current having a magnitude corresponding to a video signal supplied from the video signal line. A control terminal of the pixel switch is connected to a scan signal line (not shown), and switching operation of the switch is controlled by a scan signal supplied from the scan signal line. Note that another structure may also be employed in these pixels.

On the substrate 20, an $SiN_x$ layer and $SiO_x$ layer are sequentially formed as an undercoat layer 23. On the undercoat layer 23, semiconductor layers 211, e.g., polysilicon layers in each of which a channel, source, and drain are formed, a gate insulator 212 formed by using, e.g., tetraethyl orthosilicate (TEOS), and gate electrodes 213 made of, e.g., MoW are sequentially formed to constitute top gate thin film transistors (to be referred to as TFTs hereinafter). In this embodiment, these TFTs are used as the drive control elements 21 and pixel switches. On the gate insulator 212, scan signal lines (not shown) are further formed. Which can be formed simultaneously with forming the gate electrodes 213.

On the gate insulator 212 and gate electrodes 213, an interlayer dielectric film 24 made of $SiO_x$ etc. is formed, for example, by plasma CVD. Source and drain electrodes 25 are formed on the interlayer dielectric film 24, and covered with a passivation film 26 made of, e.g., $SiN_x$. The source and drain electrodes 25 have, e.g., a three-layered structure including Mo/Al/Mo, and are electrically connected to the source and drain, respectively, of the TFT via contact holes formed in the interlayer dielectric film 24. In addition, video signal lines (not shown) are formed on the interlayer dielectric film 24. The video signal lines can be formed simultaneously with forming the source and drain electrodes 25.

On the passivation film 26, light-transmitting first electrodes 221 are juxtaposed and spaced apart from one another. In this embodiment, the first electrode 221 is an anode, and made of a transparent conductive oxide such as indium tin oxide (ITO). The first electrode 221 is electrically connected to the drain electrode 25 via a through hole formed in the passivation film 26.

A partition insulating layer 27 is formed on the passivation film 26. In the partition insulating layer 27, through holes are formed at positions corresponding to the first electrodes 221. The partition insulating layer 27 is, e.g., an organic insulating layer, and can be formed by using photolithography.

An organic layer 222 including an emission layer is formed on each first electrode 221. The emission layer is, e.g., a thin film containing a luminescent organic compound which emits red, green, or blue light.

The organic layer 222 may also include other layers in addition to the emission layer. For example, the organic layer 222 may also include a buffer layer which mediates injection of holes from the first electrode 221 into the emission layer. The organic layer 222 may further include a hole transporting layer, hole blocking layer, electron transporting layer, and electron injection layer.

A frame-shaped release layer 222' is formed on the periphery of the passivation film 26. The release layer 222' includes at least one layer included in the organic layer 222.

A light-reflecting second electrode 223 is formed on the partition insulating layer 27 and organic layers 222. In this embodiment, the second electrode 223 is a cathode continuously formed and in common to the individual pixels. The second electrode 223 is electrically connected to interconnections formed on a layer on which the video signal lines are formed, via contact holes (not shown) formed in the passivation film 26 and partition insulating layer 27. Each organic EL element 22 includes the first electrode 221, organic layer 222, and second electrode 223.

The sealing substrate 3 faces the surface of the array substrate 2 on which the organic EL elements 22 are formed. As the sealing substrate 3, a glass substrate, resin film, or the like can be used. In this embodiment, a hard substrate such as a glass substrate is used as the sealing substrate 3 as an example.

In this embodiment, a ridge-like protrusion is formed along the periphery of a surface of the sealing substrate 3 facing the array substrate 2 such that the ridge-like protrusion has a frame-shape. That is, a frame-shaped protrusion is formed on the surface of the sealing substrate 3 facing the array substrate 2. Note that it is not always necessary to form this ridge-like protrusion on the surface of the sealing substrate 3 facing the array substrate 2.

In this embodiment, the sealing resin layer 4 covers those portions of the passivation film 26 which are not covered with the partition insulating layer 27 and the periphery of the partition insulating layer 27, and adheres to the ridge-like protrusion of the sealing substrate 3. As the material of the sealing resin layer 4, an adhesive such as a thermosetting epoxy resin or the like can be used.

The sealing resin layer 4 is formed along the peripheries of the array substrate 2 and sealing substrate 3 to have a frame-shape, thereby forming a closed space between them. This space can be filled with a rare gas such as Ar gas or an inert gas such as $N_2$ gas. A desiccant may also be placed in this space.

The organic EL display 1 can be manufactured by, e.g., the following method.

Figure 6:
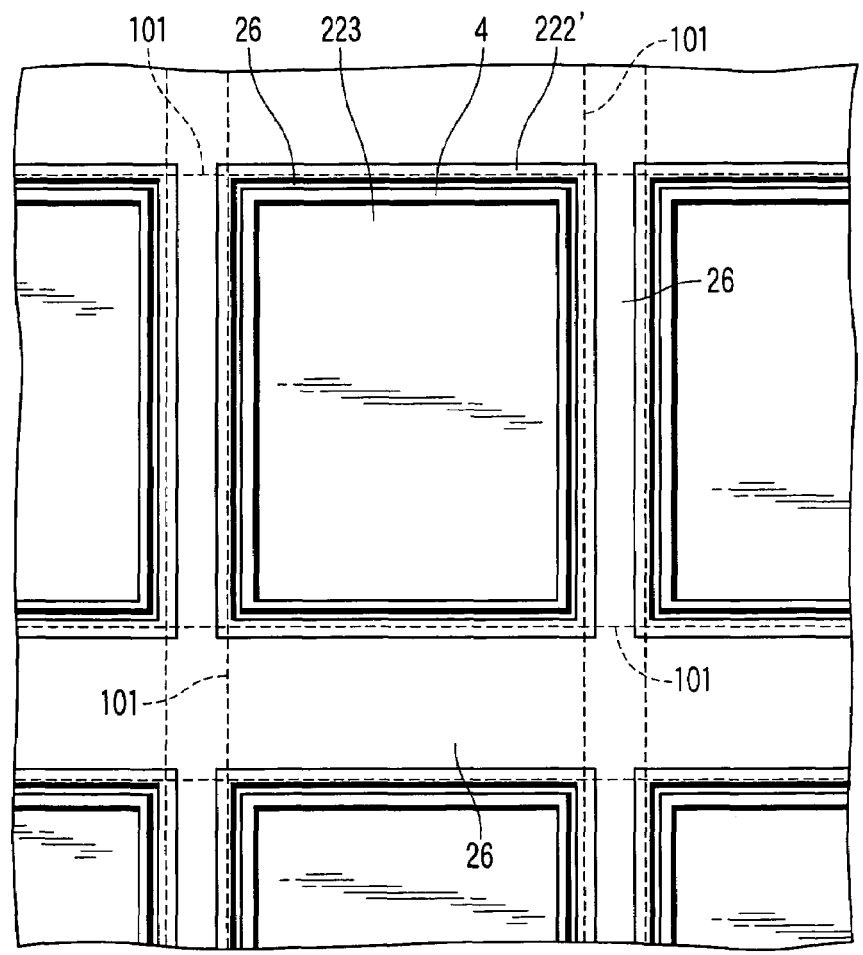
FIG. 6 is a plan view schematically showing a structure shown in FIG. 3.

FIGS. 2 to 5 are sectional views schematically showing the method of manufacturing the organic EL display according to the first embodiment of the present invention. FIG. 6 is a plan view schematically showing a structure shown in FIG. 3.

In this method, an insulating substrate 20 having an undercoat layer 23 formed on one main surface is prepared first. Then, TFTs to be used as drive control elements 21 and pixel switches, interconnections, an interlayer dielectric film 24, source and drain electrodes 25, a passivation film 26, and the like are formed on the undercoat layer 23.

After that, first electrodes 221 are formed on the passivation film 26 correspondently with pixels. The first electrodes 221 are electrically connected to the drain electrodes 25 via through holes formed in the passivation film 26.

Then, a partition insulating layer 27 having through holes at positions corresponding to the first electrodes 221 is formed on the passivation film 26 by using, e.g., photolithography.

An organic layer 222 including an emission layer is then formed on each first electrode 221. When a low-molecular compound is to be used as the material of the organic layers 222, the organic layers 222 are formed by evaporation such as vacuum evaporation by using a mask having openings corresponding to the organic layers 222. When a high-molecular compound is to be used as the material of the organic layers 222, the organic layers 222 are formed by, e.g., an inkjet method.

In this step of forming the organic layer 222, at least one layer included in the organic layer 222 is also formed on the passivation film 26. In this manner, a release layer 222' is obtained. The release layer 222' is so formed as to surround the partition insulating layer 27, and form a slight gap between the partition insulating layer 27 and release layer 222'.

The release layer 222' is ideally formed along the periphery of the partition insulating layer 27 without discontinuity, but may also be discontinuous. In this embodiment, the release layer 222' is formed along the periphery of the partition insulating layer 27 without discontinuity as an example.

After that, a second electrode 223 is formed on the partition insulating layer 27 and organic layer 222. Either a single-layered structure or multilayered structure can be used as the second electrode 223. When the second electrode 223 is to be formed, at least one layer included in the second electrode 223 may also be formed on the release layer 222'. In this embodiment, the layers forming the second electrode 223 are formed only on the organic layer 222 and partition insulating layer 27 as an example.

A structure shown in FIG. 2 is obtained as described above. Note that in FIG. 2, a broken line 101 indicates a breaking line which is aligned with the inner periphery of the release layer 222' or positioned between the inner and outer peripheries of the release layer 222'. Breaking the insulating substrate 20 to be described later is performed along the breaking line 101.

Then, as shown in FIGS. 3 and 6, a sealing resin layer 4 is formed around the partition insulating layer 27. The sealing resin layer 4 is made higher than the second electrode 223. Also, the sealing resin layer 4 is so formed that its outer periphery is positioned inside the breaking lines 101. The sealing resin layer 4 can be formed by, e.g., a dispenser method or screen printing.

Subsequently, as shown in FIG. 4, the insulating substrate 20 and a sealing substrate 3 are aligned with each other to fabricate a prebroken panel to be broken into at least one display panel. In this embodiment, a substrate having one main surface on which ridge-like protrusions corresponding to the sealing resin layer 4 are formed is used as the sealing substrate 3, and the insulating substrate 20 and sealing substrate 3 are aligned and put together such that the sealing resin layer 4 comes in contact only with the upper surfaces of the ridge-like protrusions of the sealing substrate 3.

After the sealing resin layer 4 is cured, the insulating substrate 20 is broken along the breaking lines 101, and the sealing substrate 3 is broken along breaking lines 102 positioned outside the sealing resin layer 4. In this way, an organic EL display 1 shown in FIG. 5 is obtained.

The insulating substrate 20 is broken by, e.g., the following method. First, a scriber is used to form scribe lines along the breaking lines 101 on the outer surface of the insulating substrate 20. Then, the prebroken panel is turned over, and a local pressure is applied along the scribe lines from the side of the sealing substrate 3. This enlarges cracks in the direction of thickness from the scribe lines, thereby breaking the insulating substrate 20 and films formed on it. Note that the sealing substrate 3 is also broken by substantially the same method as above.

This method can realize a high yield even when the distance between the breaking line 101 and sealing resin layer 4 is shortened. This will be explained below with reference to FIGS. 7 to 10.

Figure 7:
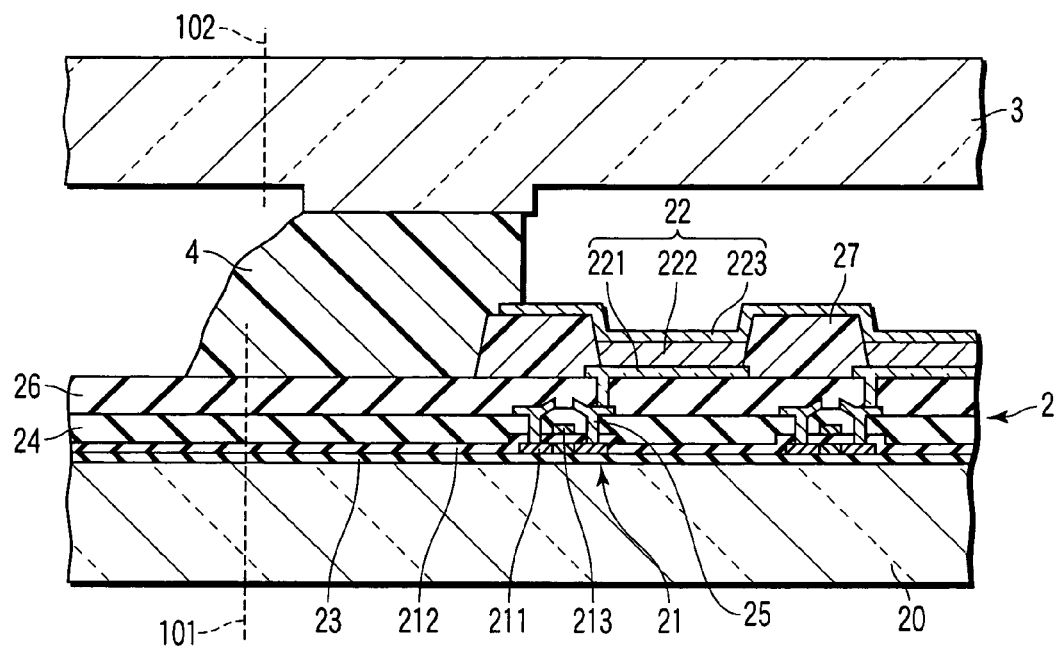
FIGS. 7 and 8 are sectional views schematically showing a breaking step when a wide sealing resin layer is formed in an organic EL display manufacturing method according to the first comparative example.
Figure 8:
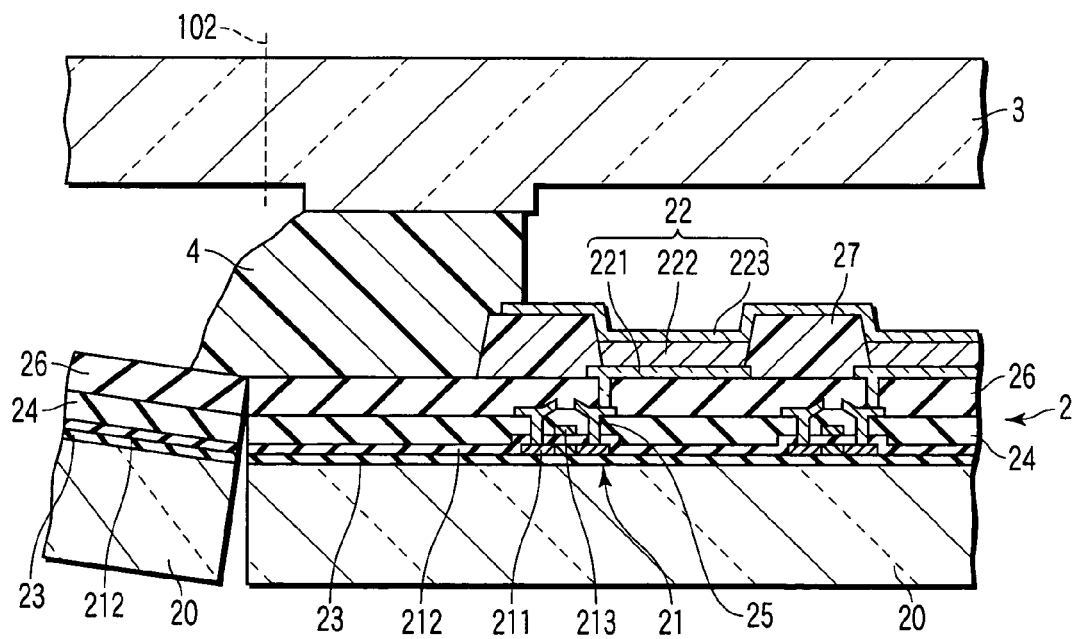
Figure 9:
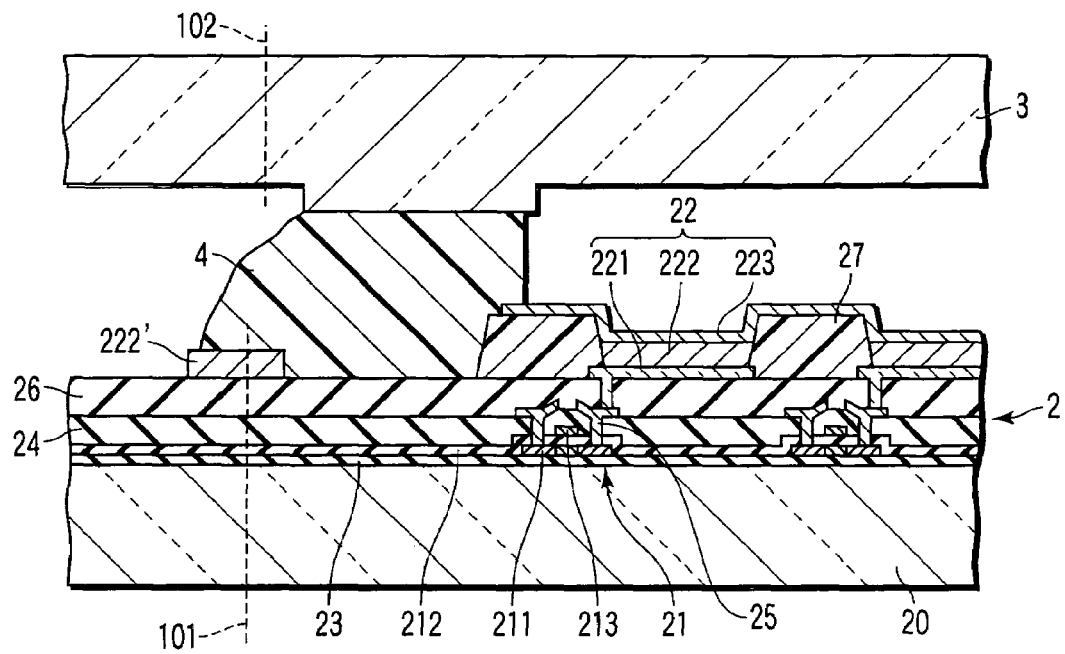
FIGS. 9 and 10 are sectional views schematically showing a breaking step when a wide sealing resin layer is formed in the method shown in FIGS. 2 to 6.
Figure 10:
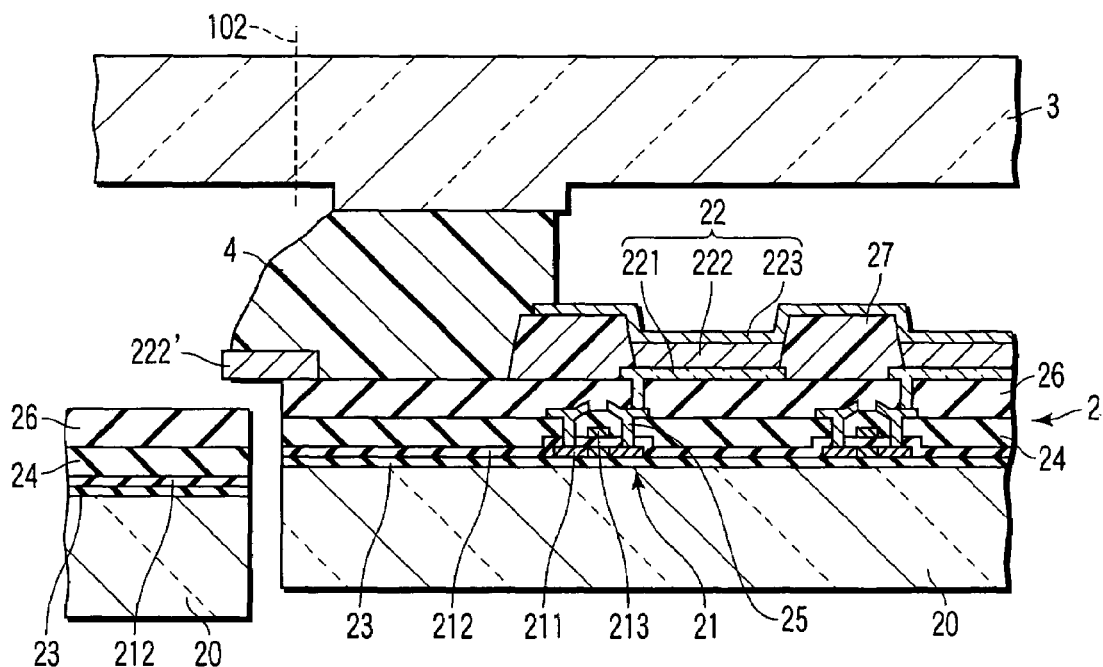

FIGS. 7 and 8 are sectional views schematically showing a breaking step when a wide sealing resin layer is formed in an organic EL display manufacturing method according to the first comparative example. FIGS. 9 and 10 are sectional views schematically showing a breaking step when a wide sealing resin layer is formed in the method shown in FIGS. 2 to 6.

When the sealing resin layer 4 is formed by, e.g., a dispenser method, the sealing resin layer 4 is sometimes partially widened. Especially when the distance between the breaking line 101 and sealing resin layer 4 is shortened, the wide portion of the sealing resin layer 4 sometimes extends over the breaking line 101.

It is extremely difficult to divide the sealing resin layer 4 in the step of breaking the insulating substrate 20. Therefore, if the sealing resin layer 4 is formed to extend over the breaking line 101 in a structure in which the release layer 222' is not formed as shown in FIG. 7, even after the insulating substrate 20 is broken, the broken insulating substrates 20 are still connected to each other via the sealing resin layer 4 as shown in FIG. 8.

The sealing resin layer 4 is made of a material having high adhesion to the adhered area of the array substrate 2 (in this embodiment, the surface of the passivation film 26) or to the adhered surface of the sealing substrate 3. Therefore, if the broken insulating substrates 20 connected via the sealing resin layer 4 are separate from each other, not only the sealing resin layer 4 but also the other constituent elements formed on the insulating substrates 20 may be damaged.

The adhesion of the release layer 222' to the passivation film 26 is much lower than that of the sealing resin layer 4 to the passivation film 26. When the structure having the release layer 222' as shown in FIG. 9 is used, therefore, even if the sealing resin layer 4 is formed to extend over the breaking line 101, the release layer 222' is readily released from the passivation film 26 as shown in FIG. 10 when the insulating substrate 20 is broken or the broken insulating substrates 20 are separated from each other.

Accordingly, when the release layer 222' is formed, the sealing resin and the other constituent elements formed on the insulating substrate 20 are not easily damaged, when compared with the case in which the release layer 222' is not formed. That is, the method according to this embodiment can realize a high yield even when the distance between the breaking line 101 and sealing resin layer 4 is shortened.

Also, in this method, the ridge-like protrusions corresponding to the sealing resin layer 4 are formed on that surface of the sealing substrate 3, which faces the array substrate 2. As shown in FIG. 9, therefore, even when the sealing resin layer 4 is partially widened, the sealing substrate 3 and sealing resin layer 4 do not easily come in contact with each other at the position of the breaking line 102. Accordingly, the broken sealing substrates 3 are not kept connected via the sealing resin layer 4. When compared with the case in which no ridge-like protrusions are formed, therefore, the sealing resin and the other constituent elements formed on the insulating substrate 20 are not easily damaged.

Note that in the structure shown in FIG. 10, the sealing resin layer 4 and release layer 222' extend from the gap between the array substrate 2 and sealing substrate 3. These extending portions of the sealing resin layer 4 and release layer 222' are removed by cutting and/or grinding after the insulating substrate 20 and sealing substrate 3 are broken.

In this embodiment, when evaporation is to be used in the formation of the organic layer 222, the release layer 222' and organic layer 222 may also be formed in different steps. Alternatively, it is possible to form at least one layer included in the organic layer 222 on the first electrode 221 and form this layer as a portion of the release layer 222' on the passivation film 26 at the same time. The organic EL display 1 can be manufactured by a smaller number of steps in the latter method than in the former method.

Note that a film having a closed ring shape cannot be formed by a normal evaporation method which uses only one mask. The following evaporation method, for example, can be used to form the release layer 222' along the periphery of the partition insulating layer 27 without discontinuity.

That is, a first thin organic film is formed on the passivation film 26 by evaporation using a first mask having an opening corresponding to a part of the release layer 222'. Then, a second thin organic film is formed on the passivation film 26 by evaporation using a second mask having an opening corresponding to another part of the release layer 222'. In this manner, the release layer 222' may also be obtained by forming a plurality of thin organic films by using a plurality of masks having different opening patterns.

The compositions of these thin organic films can be the same or different. That is, the composition of the release layer 222' can be nonuniform along its periphery.

The masks used to form these thin organic films may or may not have the openings corresponding to the organic layers 222. These openings corresponding to the organic layers 222 may also be formed only in portions of the masks used to form the thin organic films.

In the above method, the sealing resin layer 4 is so formed as to cover the peripheries of the partition insulating layer 27 and second electrode 223. However, the sealing resin layer 4 need not cover the peripheries of the partition insulating layer 27 and second electrode 223. Also, although the sealing resin layer 4 is formed not to cover the release layer 222' in the above method, the sealing resin layer 4 may also be formed so as to cover the inside of the release layer 222'.

The underlayer of the release layer 222' need not be the passivation film 26. For example, the underlayer of the release layer 222' may also be the undercoat layer 23. Typically, the underlayer of the release layer 222' is made of an inorganic material such as an inorganic insulator.

The adhered area of the array substrate 2 need not be the surface of the passivation film 26. For example, the adhered area of the array substrate 2 may be the surface of the undercoat layer 23. Typically, the adhered area of the array substrate 2 is made of an inorganic insulator.

The design value of the distance from the sealing resin layer 4 to the breaking line 101 is not particularly limited. However, the problem explained with reference to FIGS. 7 and 8 readily arises especially when the design value of this distance is small, e.g., 0.5 mm or less. Therefore, the technique according to this embodiment is particularly useful in a case like this. Note that although the lower limit of this design value is zero, it is normally set to 0.3 mm or more by taking the positional error of the scribe line or the like into account.

In the above embodiment, the organic EL display 1 is a bottom emission display. However, the organic EL display 1 may also be a top emission display. For example, it is also possible to make the second electrode 223 light-transparent, and make the first electrode light-reflecting or interpose a reflecting layer between the first electrode and the insulating substrate 20.

Also, the frame-shaped sealing resin layer 4 is formed in the above embodiment, but the entire display surface may also be coated with the sealing resin layer 4.

Furthermore, although hollow sealing is performed by using the hard sealing substrate 3 in the above embodiment, thin film sealing may also be performed instead. For example, it is also possible to form a sealing film on the second electrode 223 and the like, and adhere to this sealing film a protective film as the sealing substrate 3 via the sealing resin layer 4 as an adhesive layer. In this case, a polarizing film or the like can be used as the protective film.

The second embodiment of the present invention will be described below. In the second embodiment as will be explained below, the structure before broken includes a dummy sealing resin layer and evaluation element. The dummy sealing resin layer is positioned between an array substrate and sealing substrate, and outside a frame formed by a sealing resin layer. The dummy sealing resin layer is formed on the release layer. This dummy sealing resin layer is used to integrate unnecessary portions of the array substrate with those of the sealing substrate. The evaluation element is positioned on the array substrate and outside the frame formed by the sealing resin layer. The evaluation element has, e.g., the same layered structure as the organic EL element. This evaluation element can be used to evaluate the organic EL element.

Figure 11:
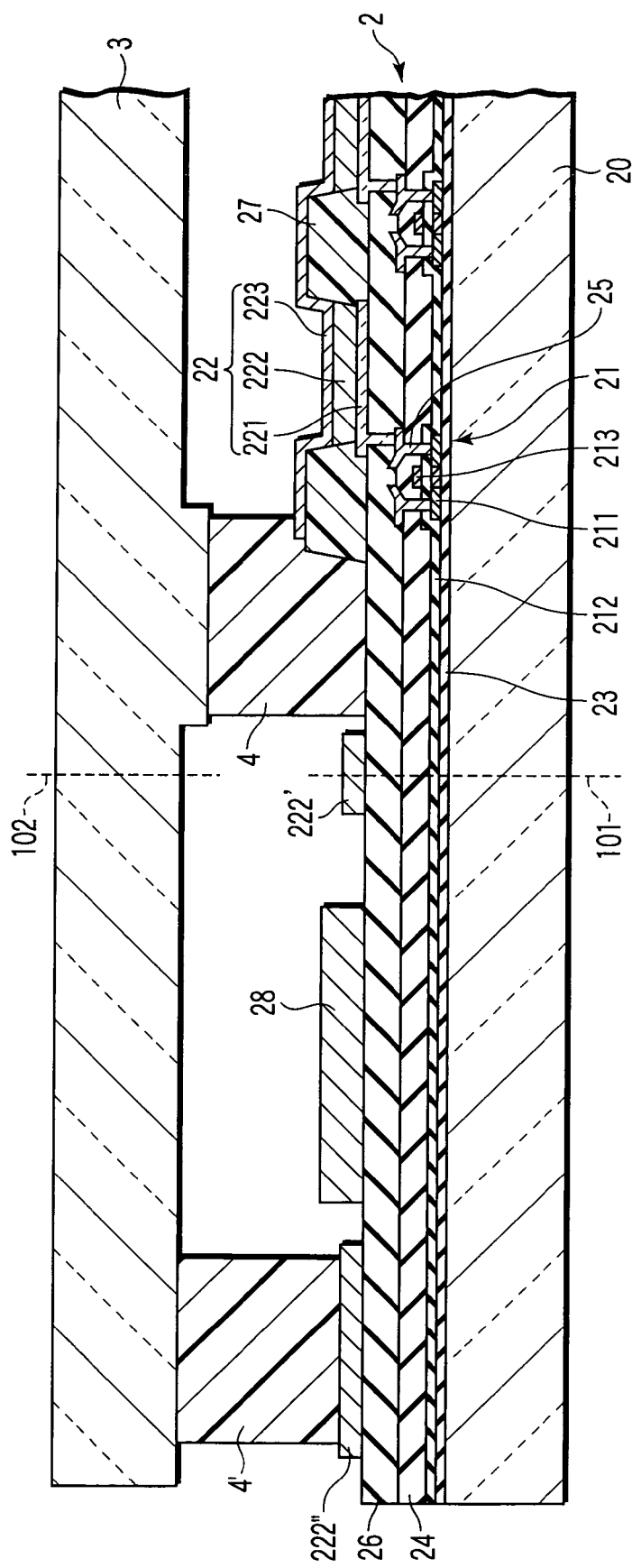
FIGS. 11 to 13 are sectional views schematically showing a method of manufacturing an organic EL display according to the second embodiment of the present invention.
Figure 12:
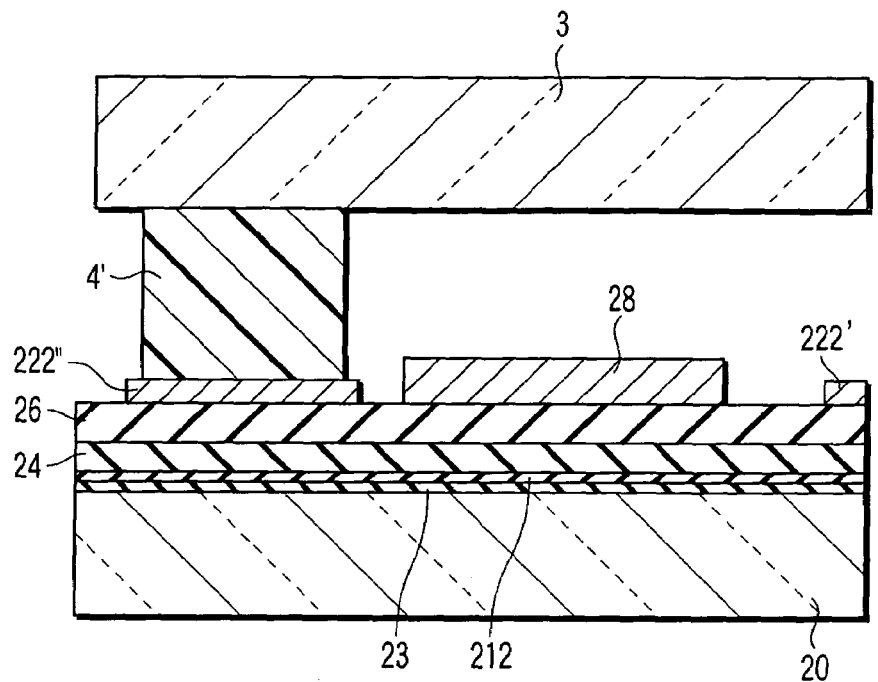
Figure 13:
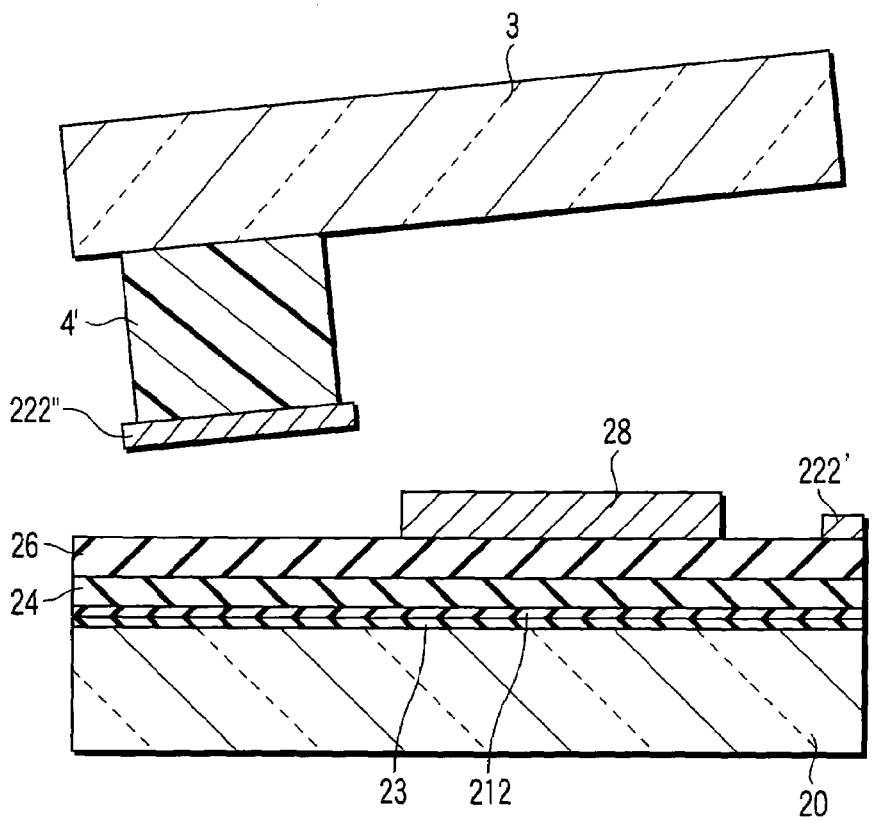

FIGS. 11 to 13 are sectional views schematically showing a method of manufacturing an organic EL display according to the second embodiment of the present invention.

In this method, an insulating substrate 20 having an undercoat layer 23 on one main surface is prepared first. Then, TFTs to be used as drive control elements 21 and pixel switches, interconnections, an interlayer dielectric film 24, source and drain electrodes 25, a passivation film 26, and the like are formed on the undercoat layer 23.

After that, first electrodes 221 are formed on the passivation film 26 correspondently with pixels. The first electrodes 221 are electrically connected to the drain electrodes 25 via through holes formed in the passivation film 26.

On the passivation film 26, a lower electrode is further formed at a position corresponding to an evaluation element 28 (to be described later). The same material as the first electrodes 221 can be used as this lower electrode. In this case, the lower electrode can be formed simultaneously with the first electrodes 221.

Then, a partition insulating layer 27 having through holes at positions corresponding to the first electrodes 221 is formed on the passivation film 26 by using, e.g., photolithography.

An organic layer 222 including an emission layer is then formed on each of the first electrodes 221 and lower electrode. When a low-molecular compound is to be used as the material of the organic layers 222, the organic layers 222 are formed by evaporation such as vacuum evaporation by using a mask having openings corresponding to the organic layers 222. When a high-molecular compound is to be used as the material of the organic layers 222, the organic layers 222 are formed by, e.g., an inkjet method. In this case, the periphery of the lower electrode may be covered with the partition insulating layer 27.

In the step of forming the organic layers 222, at least one layer included in the organic layer 222 is also formed on the passivation film 26. In this manner, first and second release layer 222' and 222'' are obtained.

The first release layer 222' is so formed as to surround the partition insulating layer 27, and form a slight gap between the partition insulating layer 27 and release layer 222'. The first release layer 222' is ideally formed along the periphery of the partition insulating layer 27 without discontinuity, but may be partially discontinuous. In this embodiment, the release layer 222' is formed along the periphery of the partition insulating layer 27 without discontinuity as an example.

The second release layer 222'' is used as the underlayer of a dummy sealing resin layer (to be described later). The second release layer 222'' is positioned outside the frame formed by the first release layer 222'.

The first release layer 222' may be spaced apart from the second release layer 222''. Alternatively, the first release layer 222' may be connected to the second release layer 222''. The organic layer on the lower electrode may be spaced apart from the release layers 222' and 222''. Alternatively, the organic layer on the lower electrode may be connected to at least one of the release layers 222' and 222''.

After that, a second electrode 223 is formed on the partition insulating layer 27 and organic layer 222. Either a single-layered structure or multilayered structure can be used as the second electrode 223. When the second electrode 223 is to be formed, at least one layer included in the second electrode 223 may also be formed on the release layer 222'. In this embodiment, the layers included in the second electrode 223 are formed only on the organic layer 222 and partition insulating layer 27 as an example.

An upper electrode is formed at a position of the lower electrode. The same material as the second electrode 223 can be used as the upper electrode. In this case, the upper electrode and the second electrode 223 can be simultaneously formed. When this upper electrode is formed, an organic EL element including the lower electrode, the upper electrode, and the organic layer interposed between them is obtained as the evaluation element 28.

The evaluation element 28 need not be an organic EL element. For example, the evaluation element 28 may be one of the constituent elements of the organic EL element. Alternatively, the constituent elements of the evaluation element 28 may be different from those of the organic EL element. Furthermore, it is possible to form one or a plurality of evaluation elements 28. In the latter case, the structures of the evaluation elements 28 may be the same or different. This makes various evaluations possible.

Then, a sealing resin layer 4 is formed around the partition insulating layer 27, and a dummy sealing resin layer 4' is formed on the release layer 222". The sealing resin layer 4 and dummy sealing resin layer 4' are made higher than the second electrode 223. The sealing resin layer 4 is so formed that its outer periphery is positioned inside a breaking line 101. The dummy sealing resin layer 4' is typically formed so as not to come in contact with the passivation film 26. The sealing resin layer 4 and dummy sealing resin layer 4' can be formed by, e.g., a dispenser method or screen printing.

Subsequently, the insulating substrate 20 and a sealing substrate 3 are put together, and the sealing resin layer 4 and dummy sealing resin layer 4' are cured. After that, following the same procedures as explained in the first embodiment, the insulating substrate 20 is broken along the breaking lines 101, and the sealing substrate 3 is broken along breaking lines 102 positioned outside the sealing resin layer 4. In this manner, the organic EL display 1 shown in FIGS. 1 and 5 is obtained.

In this embodiment as will be explained below, that portion of the array substrate 2 and sealing substrate 3, which is separated from the organic EL display 1 by breaking the insulating substrate 20 and sealing substrate 3, i.e., a structure shown in FIG. 12, is used to evaluate an element included in the organic EL display 1.

First, as shown in FIG. 13, the sealing substrate 3 is removed from the insulating substrate 20. Since the release layer 222"exists between the dummy sealing resin layer 4' and passivation film 26, the sealing substrate 3 is readily released together with the dummy sealing resin layer 4' and release layer 222" from the insulating substrate 20.

Note that if the dummy sealing resin layer 4' is not formed, the organic EL display 1 and/or the evaluation element 28 is easily damaged when the insulating substrate 20 and sealing substrate 3 are broken. This damage can be suppressed by the formation of the dummy sealing resin layer 4'.

Then, the evaluation element 28 is evaluated. When the evaluation element 28 is an organic EL element, the emission efficiency or the like is evaluated. When the evaluation element 28 is one constituent element of an organic EL element, the film thickness or the like is evaluated.

After that, the evaluation result is fed back to the manufacturing line. For example, the film formation conditions are changed on the basis of this evaluation result.

In this embodiment as described above, the release layer 222' explained in the first embodiment is formed. Accordingly, the same effect as explained in the first embodiment can be obtained in this embodiment as well.

Also, in this embodiment, the release layer 222" is formed between the dummy sealing resin layer 4' and passivation film 26. Therefore, destruction of the evaluation element 28 can be prevented as explained below.

Figure 15:
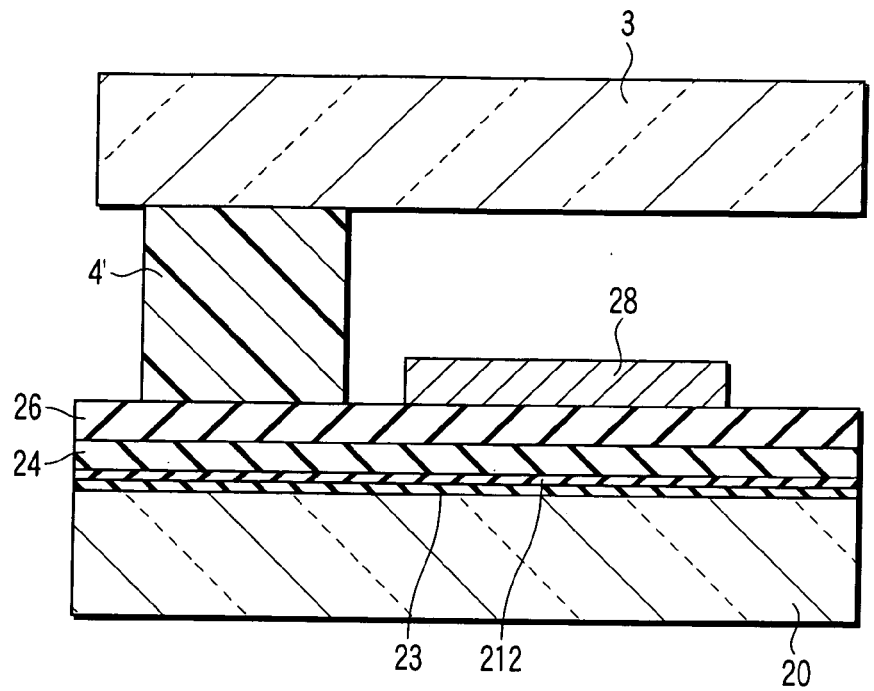

FIGS. 14 and 15 are sectional views schematically showing a method of manufacturing an organic EL display according to the second comparative example. This method is the same as the method explained with reference to FIGS. 11 to 13 except that the release layers 222' and 222" are omitted.

The dummy sealing resin layer 4' shows high adhesion to both the passivation film 26 and sealing substrate 3. If the release layer 222" is omitted, therefore, the sealing substrate 3 and/or the insulating substrate 20 is readily damaged when the sealing substrate 3 is removed from the insulating substrate 20. That is, the method shown in FIGS. 14 and 15 readily destroys the evaluation element 28 and the like.

By contrast, in the method shown in FIGS. 11 to 13 as described above, the release layer 222" is interposed between the dummy sealing resin layer 4' and passivation film 26. Accordingly, the sealing substrate 3 and/or the insulating substrate 20 is not easily damaged when the sealing substrate 3 is removed from the insulating substrate 20. In this embodiment, therefore, destruction of the evaluation element 28 and the like can be prevented. Note that this effect can be obtained even when the release layer 222' is not formed.

Examples of the present invention will be described below.

EXAMPLE 1

Figure 16:
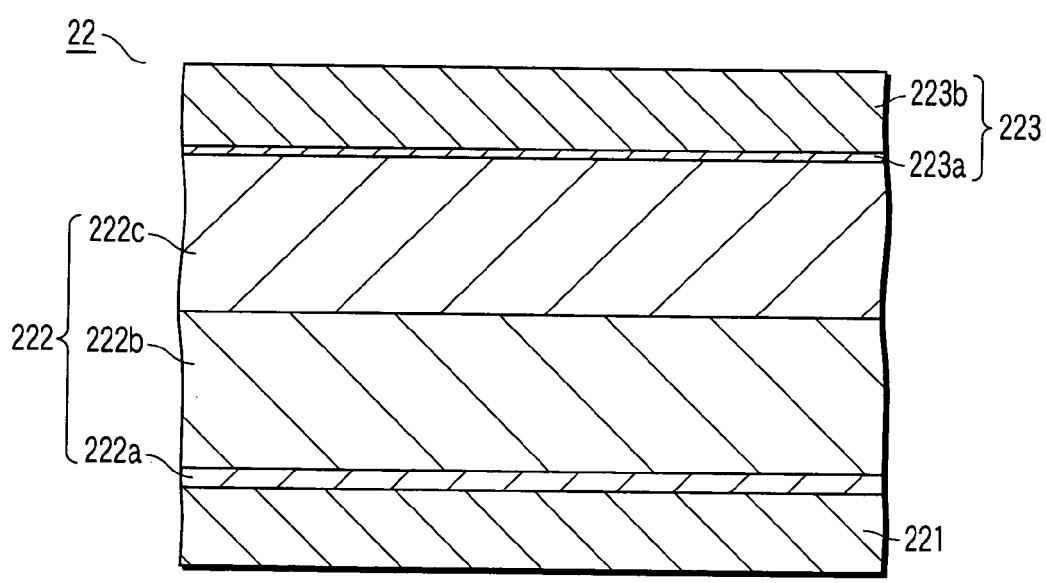
FIG. 16 is a sectional view schematically showing an organic EL element of organic EL displays manufactured in Example 1.
Figure 17:
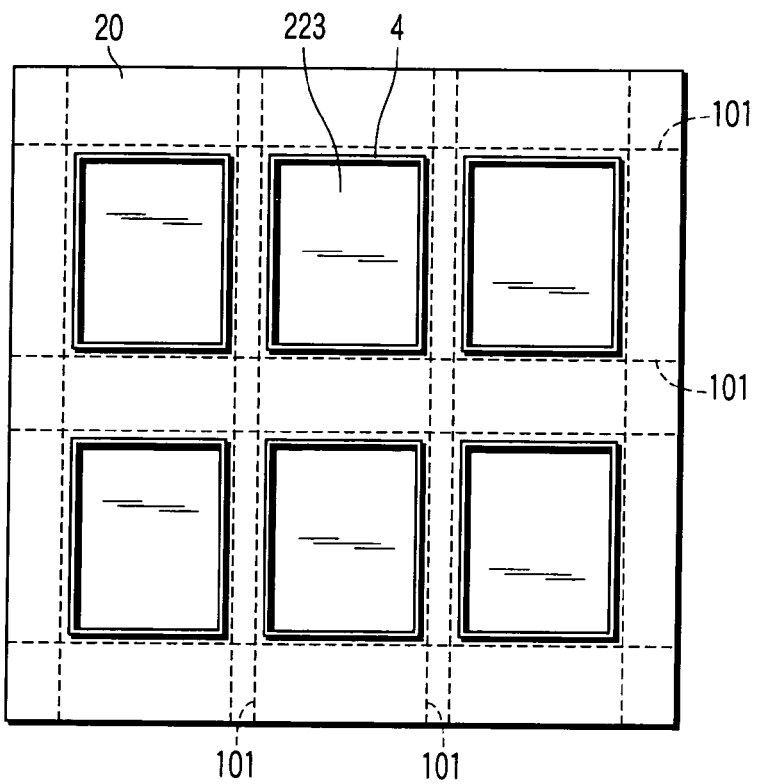
FIG. 17 is a plan view schematically showing an array substrate before broken which was used for manufacturing the organic EL displays in Example 1.

FIG. 16 is a sectional view schematically showing an organic EL element of organic EL displays manufactured in Example 1. FIG. 17 is a plan view schematically showing an array substrate before broken which was used for manufacturing the organic EL displays in Example 1. Note that in FIG. 17, only an insulating substrate 20, second electrodes 223, and sealing resin layers 4 are illustrated, and other constituent elements are omitted.

In this example, the organic EL display 1 shown in FIG. 1 was manufactured as follows.

First, as an insulating substrate 20 before broken, a 150 mm×150 mm glass substrate having an undercoat layer 23 on one main surface was prepared.

In this example as will be explained below, the insulating substrate 20 was used to manufacture six 2.2-inch organic EL displays 1.

Then, TFTs to be used as drive control elements 21 and pixel switches, interconnections, an interlayer insulating film 24, source and drain electrodes 25, a passivation film 26, and the like were formed on the undercoat layer 23. In this example, silicon nitride was used as the material of the passivation film 26.

After that, first electrodes 221 made of ITO were formed on the passivation film 26 correspondingly with pixels. The first electrodes 221 were electrically connected to the drain electrodes 25 via through holes formed in the passivation film 26.

Then, on the passivation film 26, a partition insulating layer 27 having through holes at positions corresponding to the first electrodes 221 was formed by using photolithography.

Thereafter, an organic layer 222 including an emission layer was formed on each first electrode 221 by vacuum evaporation. More specifically, as shown in FIG. 16, a 10-nm thick hole injection layer 222a made of copper phthalocyanine (CuPc), a 500-nm thick hole transporting layer 222b made of 4,4'-bis[N-(1-naphtyl)-N-phenyl-amino]biphenyl (αNPD), and a 500-nm thick emission layer/electron transporting layer 222c made of tris(8-hydroxyquinolate)aluminum ($Alq_3$) were sequentially formed.

Subsequently, second electrodes 223 were formed on the organic layers 222 by vacuum evaporation. More specifically, as shown in FIG. 16, a 1-nm thick lithium fluoride layer 223a was formed, and a 100-nm thick aluminum layer 223b was formed on it.

At the same time the organic layers 222 and second electrodes 223 were formed, a release layer 222' was formed on the passivation film 26. In this example, the release layer 222' was constituted by the hole injection layer 222a, hole transporting layer 222b, emission layer/electron transporting layer 222c, and lithium fluoride layer 223a. Also, as shown in FIG. 6, the release layer 222' was formed to be spaced apart from the partition insulating layer 27 and to extend over a breaking line 101. In this manner, the structure shown in FIG. 2 was obtained.

Then, as shown in FIGS. 3, 6, and 17, a sealing resin layer 4 was formed around the partition insulating layer 27 by a dispenser method. A thermosetting epoxy resin was used as the material of the sealing resin layer 4. Also, in this example, the sealing resin layer 4 was so formed as not to extend over the breaking line 101.

Subsequently, as shown in FIG. 4, the insulating substrate 20 and a sealing substrate 3 were put together. As the sealing substrate 3, a glass substrate having one main surface on which ridge-like protrusions corresponding to the sealing resin layer 4 were formed was used. The insulating substrate 20 and sealing substrate 3 were aligned and put together such that the sealing resin layer 4 came in contact only with the upper surfaces of the ridge-like protrusions of the sealing substrate 3.

After the sealing resin layer 4 was cured, the insulating substrate 20 was broken along the breaking lines 101, and the sealing substrate 3 was broken along breaking lines 102 positioned outside the sealing resin layer 4. In this way, six organic EL displays 1 shown in FIGS. 1 and 5 were manufactured.

In this example, the broken substrates were not kept connected together via the sealing resin layer 4. Also, all the obtained organic EL displays 1 were found to be good products by evaluation.

EXAMPLE 2

Figure 18:
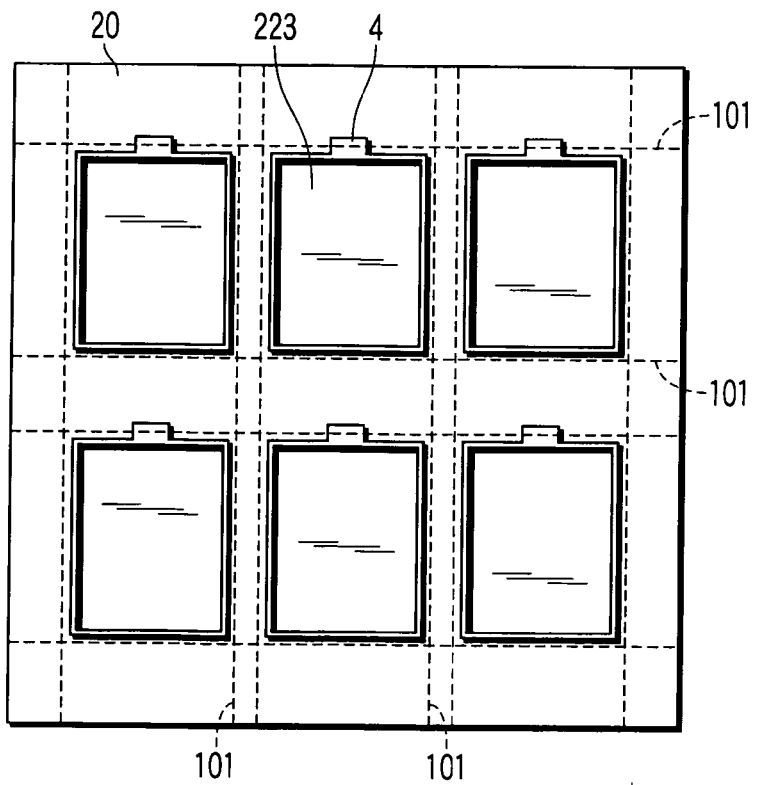
FIG. 18 is a plan view schematically showing an array substrate before broken which was used for manufacturing the organic EL displays in Example 2.

FIG. 18 is a plan view schematically showing an array substrate before broken which was used for manufacturing the organic EL displays in Example 2. Note that in FIG. 18, only an insulating substrate 20, second electrodes 223, and sealing resin layers 4 are illustrated, and other constituent elements are omitted.

In this example, six organic EL displays 1 shown in FIG. 1 were manufactured following the same procedures as in Example 1 except that the sealing resin layers 4 had a shape shown in FIG. 18. More specifically, in this example, each sealing resin layer 4 was so formed as to partially extend over a breaking line 101 by a length of 5 mm as shown in FIG. 18.

In this example, the broken substrates were not kept connected together via the sealing resin layers 4. Also, all the obtained organic EL displays 1 were found to be good products by evaluation.

EXAMPLE 3

In this example, six organic EL displays were manufactured following the same procedures as in Example 2 except that no release layer 222' was formed.

In this example, broken substrates 20 were kept connected together via sealing resin layers 4. When a large force was applied to the insulating substrates 20 to separate them, some substrates cracked. Consequently, only two of the six organic EL displays were good products.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing an organic EL display, comprising:

forming organic EL elements on a first portion of a first substrate which comprises the first portion and a second portion, wherein each of the organic EL elements comprises a pair of electrodes and an organic layer interposed between the electrodes and including an emission layer;

forming a frame-shaped sealing resin layer on the first portion such that the frame-shaped sealing resin layer surrounds the organic EL elements;

putting the first substrate and a second substrate together such that the frame-shaped sealing resin layer is interposed between the first and second substrates, thereby forming a prebroken panel to be broken into at least one display panel; and breaking the first substrate of the prebroken panel along a boundary between the first and second portions, wherein, before forming the frame-shaped sealing resin layer, a release layer is formed on the second portion at a position adjacent to the boundary, the release layer comprising a layer made of a material equal to a material of a layer included in the organic layer.

2. The method according to claim 1, wherein the release layer is formed simultaneously with formation of the organic layer.

3. The method according to claim 1, wherein the release layer is formed to lie across the boundary.

4. The method according to claim 1, further comprising breaking the second substrate of the prebroken panel at a position outside the frame-shaped sealing resin layer.

5. The method according to claim 1, wherein a main surface of the second substrate facing the first substrate comprises a frame-shaped protrusion at a position corresponding to the frame-shaped sealing resin layer.

6. The method according to claim 1, wherein forming the organic EL elements comprises:

forming a first organic layer on the first substrate by evaporation using a first mask which is provided with openings corresponding to the organic EL elements and an opening corresponding to a part of the release layer; and forming a second organic layer on the first substrate by evaporation using a second mask which is provided with openings corresponding to the organic EL elements and an opening corresponding to another part of the release layer.

7. The method according to claim 1, wherein an underlayer on which the release layer is formed is made of inorganic insulator.

8. The method according to claim 1, wherein a design value of a distance between the frame-shaped sealing resin layer and the boundary is set at 0.5 mm or less.

9. A method of manufacturing an organic EL display, comprising:
- forming organic EL elements on a first portion of a first substrate which comprises the first portion and a second portion, wherein each of the organic EL elements comprises a pair of electrodes and an organic layer interposed between the electrodes and including an emission layer;
- forming a frame-shaped sealing resin layer and a dummy sealing resin layer on the first and second portions, respectively, such that the frame-shaped sealing resin layer surrounds the organic EL elements and is spaced apart from the dummy sealing resin layer;
- putting the first substrate and a second substrate together such that the first portion faces a third portion of the second substrate with the frame-shaped sealing resin layer interposed therebetween and the second portion faces a fourth portion of the second substrate with the dummy sealing resin layer interposed therebetween, thereby forming a prebroken panel to be broken into at least one display panel;
- breaking the first substrate of the prebroken panel along a first boundary between the first and second portions; and
- breaking the second substrate of the prebroken panel along a second boundary between the third and fourth portions,
- wherein, before forming the frame-shaped sealing resin layer, a first release layer is formed on the second portion at a position adjacent to the first boundary, the first release layer comprising a layer made of a material equal to a material of a layer included in the organic layer, and
- wherein, before forming the dummy sealing resin layer, a second release layer is formed on the second portion at a position where the dummy sealing resin layer is to be formed, the second release layer comprising a layer made of a material equal to a material of a layer included in the organic layer.

10. The method according to claim 9, wherein the first and second release layers are formed simultaneously with formation of the organic layer.

11. The method according to claim 9, wherein the first release layer is formed to lie across the first boundary.

12. The method according to claim 9, further comprising removing the second portion from the fourth portion after breaking the first and second substrates.

13. A method of manufacturing an organic EL display, comprising:
- forming organic EL elements on a first portion of a first substrate which comprises the first portion and a second portion, wherein each of the organic EL elements comprises a pair of electrodes and an organic layer interposed between the electrodes and including an emission layer;
- forming a frame-shaped sealing resin layer and a dummy sealing resin layer on the first and second portions, respectively, such that the frame-shaped sealing resin layer surrounds the organic EL elements and is spaced apart from the dummy sealing resin layer;
- putting the first substrate and a second substrate together such that the first portion faces a third portion of the second substrate with the frame-shaped sealing resin layer interposed therebetween and the second portion faces a fourth portion of the second substrate with the dummy sealing resin layer interposed therebetween, thereby forming a prebroken panel to be broken into at least one display panel;
- breaking the first substrate of the prebroken panel along a first boundary between the first and second portions; and
- breaking the second substrate of the prebroken panel along a second boundary between the third and fourth portions,
- wherein, before forming the dummy sealing resin layer, a release layer is formed on the second portion at a position where the dummy sealing resin layer is to be formed, the release layer comprising a layer made of a material equal to a material of a layer included in the organic layer.

14. The method according to claim 13, the release layer is formed simultaneously with formation of the organic layer.

15. The method according to claim 13, further comprising removing the second portion from the fourth portion after breaking the first and second substrates.

* * * * *